US008923778B2

(12) United States Patent
Klomsdorf et al.

(10) Patent No.: US 8,923,778 B2
(45) Date of Patent: Dec. 30, 2014

(54) METHOD FOR AUTOMATIC FREQUENCY CORRECTION IN A MULTI-CARRIER COMMUNICATIONS DEVICE

(75) Inventors: Armin W. Klomsdorf, Chicago, IL (US); William P. Alberth, Jr., Prairie Grove, IL (US); Gregory R. Black, Vernon Hills, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 186 days.

(21) Appl. No.: 13/589,503

(22) Filed: Aug. 20, 2012

(65) Prior Publication Data

US 2014/0051366 A1  Feb. 20, 2014

(51) Int. Cl.
 *H04B 1/40* (2006.01)
 *H04M 1/00* (2006.01)
(52) U.S. Cl.
 USPC ................ 455/75; 455/552.1; 455/553.1
(58) Field of Classification Search
 CPC .......... H04B 1/50; H04B 1/403; H04B 1/408; H03J 7/02; H03J 7/04; H03C 3/0958
 USPC ............ 455/75, 84, 192.1, 192.2, 196, 552.1, 455/553.1; 375/219, 344
 See application file for complete search history.

(56) References Cited

U.S. PATENT DOCUMENTS

| 5,111,162 | A | | 5/1992 | Hietala et al. |
| 6,081,563 | A | * | 6/2000 | Taga et al. ................ 375/344 |
| 6,356,599 | B1 | | 3/2002 | Lee |
| 6,571,088 | B1 | * | 5/2003 | Hasegawa .................. 455/192.2 |
| 7,039,438 | B2 | * | 5/2006 | Khlat .......................... 455/552.1 |
| 7,062,240 | B2 | | 6/2006 | Ballantyne et al. |
| 7,991,378 | B2 | | 8/2011 | Lindoff et al. |
| 8,009,089 | B2 | * | 8/2011 | Yanni ........................ 342/357.62 |
| 8,401,503 | B2 | * | 3/2013 | Chung et al. .............. 455/553.1 |
| 2003/0214436 | A1 | | 11/2003 | Voor et al. |
| 2009/0088085 | A1 | | 4/2009 | Nisson et al. |
| 2009/0258628 | A1 | | 10/2009 | Lindoff et al. |
| 2012/0207010 | A1 | | 8/2012 | Egawa et al. |

FOREIGN PATENT DOCUMENTS

| WO | 2004030232 A1 | 4/2004 |
| WO | 2004055543 A1 | 7/2004 |

OTHER PUBLICATIONS

Patent Cooperation Treaty, International Search Report and Written Opinion of the International Searching Authority for International Application No. PCT/US2013/053372, Nov. 22, 2013, 10 pages.

* cited by examiner

*Primary Examiner* — Quochien B Vuong
(74) *Attorney, Agent, or Firm* — Faegre Baker Daniels LLP

(57) ABSTRACT

A method and system provides an automatic frequency correction (AFC) within a wireless communication device. A synchronization controller estimates first and second frequency errors respectively associated with a first received signal corresponding to a first receiver path and a second received signal corresponding to a second receiver path. The synchronization controller determines a value and a type of target clock of a first AFC associated with the first frequency error. If the first AFC is not generated to target a shared clock such as a reference clock, the synchronization controller generates a second AFC to compensate for the second frequency error. However, if it is determined that the first AFC targets a shared clock, the synchronization controller generates the second AFC to compensate for the first AFC and the second frequency error. The synchronization controller synchronously applies the first and second AFCs to the relevant clocks.

20 Claims, 7 Drawing Sheets

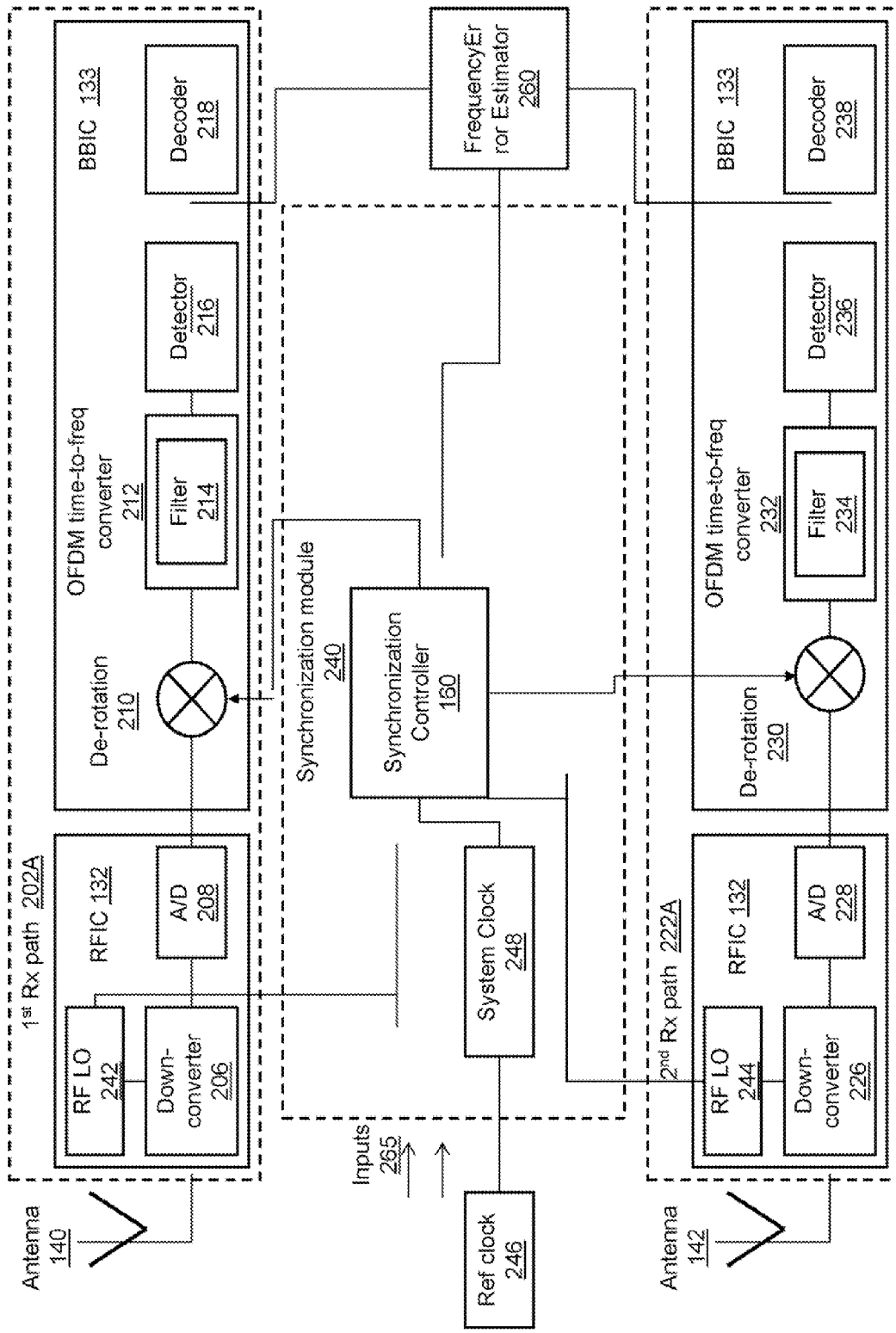

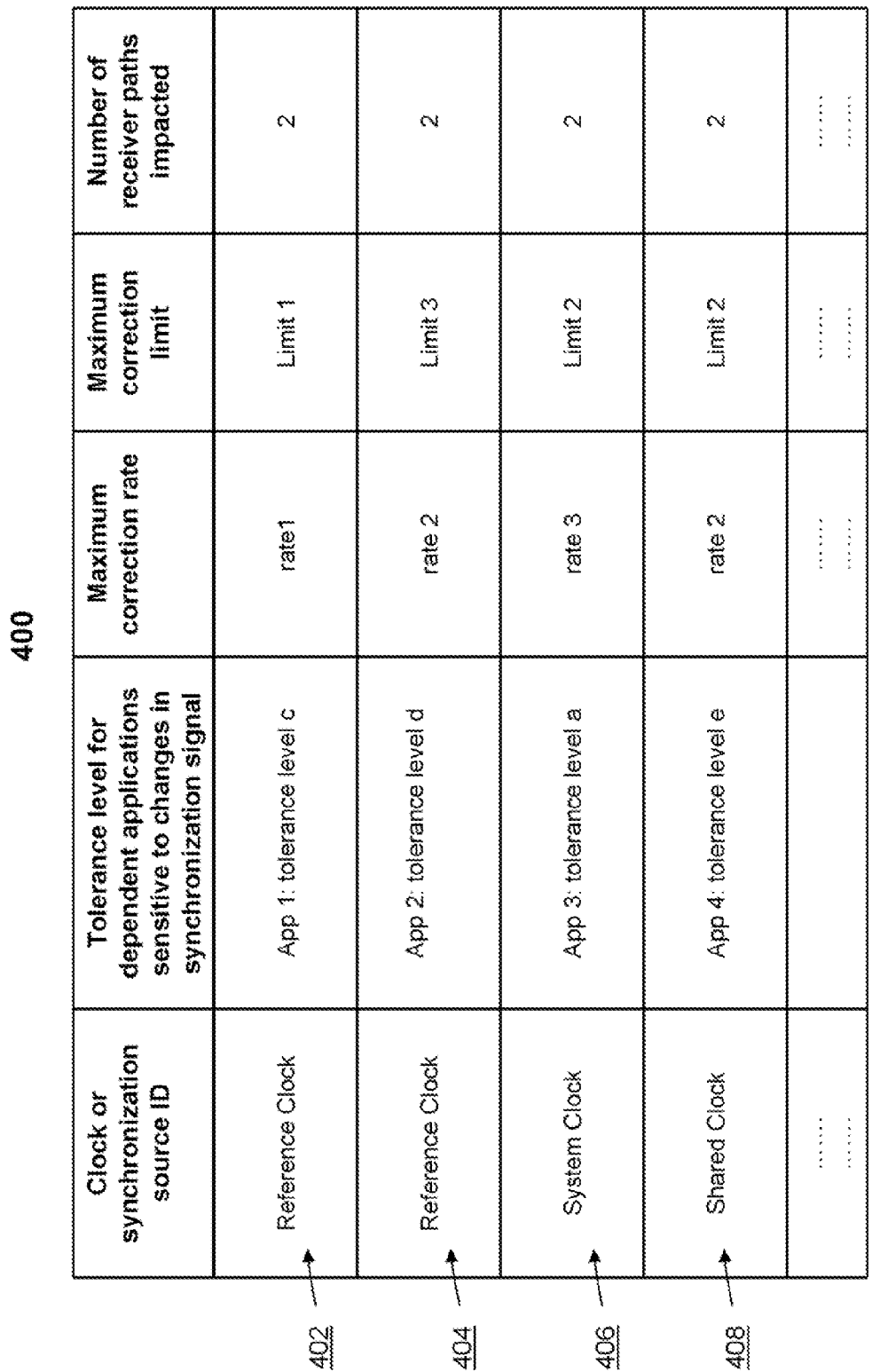

FIG. 4

| Clock or synchronization source ID | Tolerance level for dependent applications sensitive to changes in synchronization signal | Maximum correction rate | Maximum correction limit | Number of receiver paths impacted |
|---|---|---|---|---|
| Reference Clock | App 1: tolerance level c | rate1 | Limit 1 | 2 |
| Reference Clock | App 2: tolerance level d | rate 2 | Limit 3 | 2 |
| System Clock | App 3: tolerance level a | rate 3 | Limit 2 | 2 |
| Shared Clock | App 4: tolerance level e | rate 2 | Limit 2 | 2 |
| ..... | | | | ..... |

400

402
404
406
408

METHOD FOR AUTOMATIC FREQUENCY CORRECTION IN A MULTI-CARRIER COMMUNICATIONS DEVICE

BACKGROUND

1. Technical Field

The present disclosure relates in general to wireless communication devices and in particular to frequency correction in wireless communication devices.

2. Description of the Related Art

Carrier aggregation (CA) increases device throughput and improves network load leveling performance for a wireless communication device. A wireless communication device operating in a CA mode utilizes at least two receivers and/or at least two transmitters. Frequency error values may differ between two corresponding carriers based on a number of factors including cell tower-to-carrier mapping and handover, carrier frequency and Doppler rate. Separate automatic frequency corrections (AFCs) corresponding to two reference and/or system clock domains can be used to respectively compensate for the different frequency error values. Although two reference and/or system clock domains corresponding to separate AFCs can be used, it is more desirable to share the reference/system clock and minimize the number of phase locked loops utilized, especially for single radio frequency (RF) transceiver implementations.

BRIEF DESCRIPTION OF THE DRAWINGS

The described embodiments are to be read in conjunction with the accompanying drawings, wherein:

FIG. 2A provides a block diagram representation of a transceiver module having a pair of receiver paths and a synchronization module, according to one embodiment;

FIG. 4 is a table that provides information about a maximum correction rate and a maximum correction limit for a number of clocks within transceiver 130, according to one embodiment.

DETAILED DESCRIPTION

Figure 1:
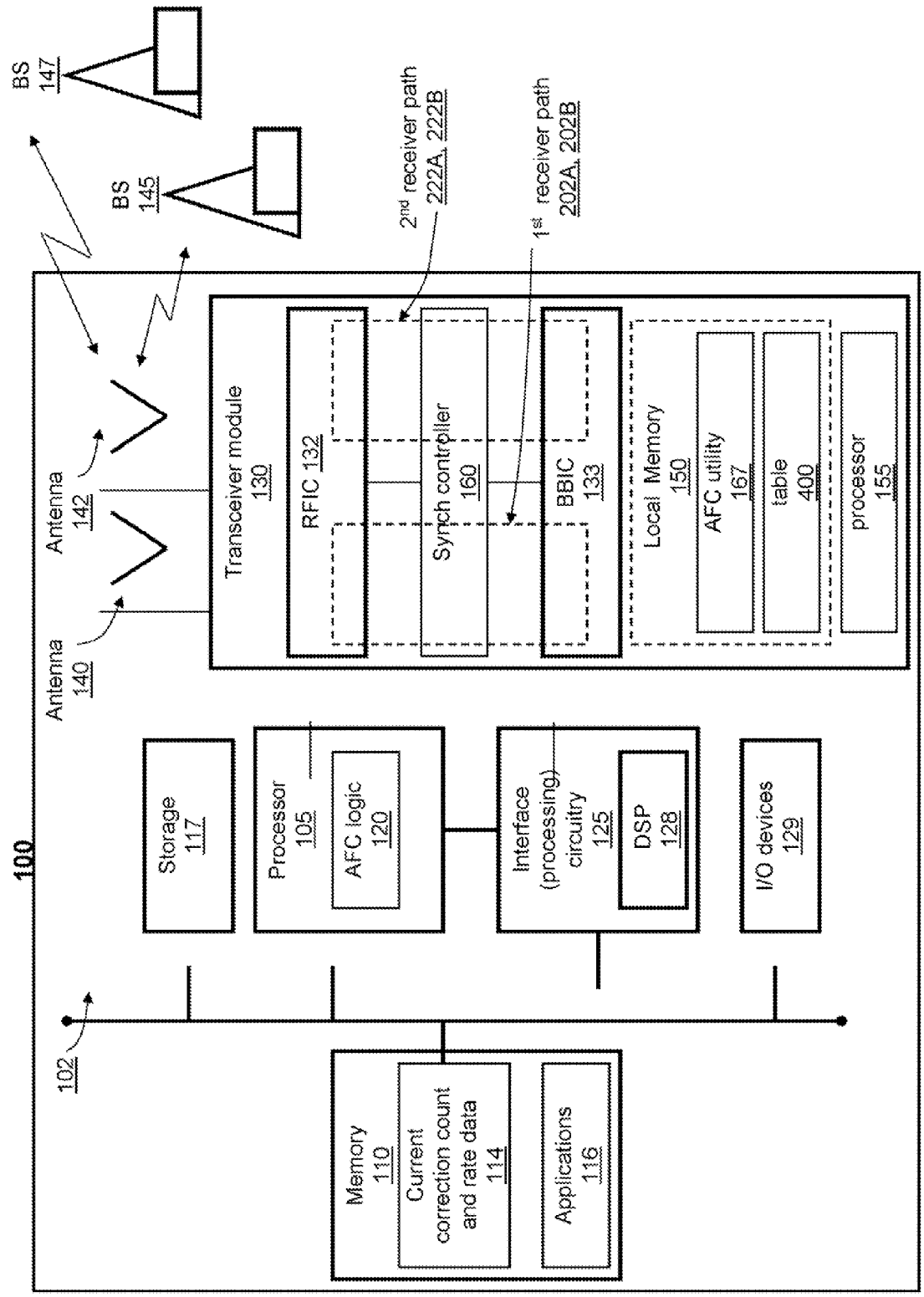
FIG. 1 is a block diagram illustrating an example wireless communication device within which the various features of the described embodiments can be advantageously implemented, according to one embodiment.

The illustrative embodiments provide a method and system for providing an automatic frequency correction (AFC) within a wireless communication device. A synchronization controller estimates first and second frequency errors respectively associated with a first received signal corresponding to a first receiver path and a second received signal corresponding to a second receiver path. The synchronization controller determines a value and a type of target clock of a first AFC associated with the first frequency error. If the first AFC is not generated to target a shared clock such as a reference clock, the synchronization controller generates a second AFC to compensate for the second frequency error. However, if the first AFC is determined to target a shared clock such as the reference clock, the synchronization controller generates the second AFC to compensate for the first AFC and the second frequency error. The synchronization controller synchronously applies the first and second AFCs to the relevant clocks.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein.

With specific reference now to FIG. 1, there is depicted a block diagram of an example wireless communication device 100, within which the functional aspects of the described embodiments may be implemented. Wireless communication device 100 represents a device that is adapted to transmit and receive electromagnetic signals over an air interface via uplink and/or downlink channels between the wireless communication device 100 and communication network equipment (e.g., base-stations 145, 147) utilizing a plurality of different communication standards, such as Global System for Mobile Communications (GSM) Code Division Multiple Access (CDMA), Orthogonal Frequency Division Multiple Access (OFDMA), and similar systems. In addition, wireless communication device 100 is able to utilize a number of communication standards such as carrier aggregation and simultaneous voice and LTE (SVLTE). In one or more embodiments, the wireless communication device can be a mobile cellular device/phone or smartphone, or laptop, netbook or tablet computing device, or other types of communications devices. Wireless communication device 100 comprises processor 105 and interface circuitry 125, which are connected to memory component 110 via signal bus 102. Interface circuitry 125 includes digital signal processor (DSP) 128. Wireless communication device 100 also includes a transceiver module 130 for sending and receiving communication signals. In at least some embodiments, the sending and receiving of communication signals occur wirelessly and are facilitated by one or more antennas 140 and 142 coupled to the transceiver module 130. The number of antennas can vary from device to device, ranging from a single antenna to two or more antennas, and the presentation within wireless communication device 100 of two antennas 140, 142 is merely for illustration.

Wireless communication device 100 is able to wirelessly communicate to base-stations 145 and 147 via antenna 140 and/or antenna 142. Base stations 145, 147 can be any one of a number of different types of network stations and/or antennas associated with the infrastructure of the wireless network and configured to support uplink and downlink communication via one or more of the wireless communication protocols, as known by those skilled in the art.

Transceiver module 130 comprises baseband modem integrated circuit (BBIC) 133 and radio frequency integrated circuit (RFIC) 132. Transceiver module 130 comprises a memory or storage system 150, synchronization controller 160 and first and second receiver paths 202A, 202B and 222A, 222B. First and second receiver paths 202A, 202B and 222A, 222B comprise a number of components shown in FIGS. 2A and 2B. Synchronization controller 160 is communicatively coupled to both first and second receiver paths 202A, 202B and 222A, 222B. In one embodiment, transceiver module 130 also includes local processor 155, which can be described as a digital signal processor (DSP). According to one aspect of the disclosure, local memory/storage 150 includes therein firmware, such as Antenna Frequency Correction (AFC) utility 167, which supports the various processing functions of transceiver module 130. The structural makeup of transceiver module 130 is described in greater detail in FIGS. 2A and 2B.

In addition to the above described hardware components of wireless communication device 100, various features of the invention may be completed or supported via software (or firmware) code and/or logic stored within at least one of memory 110 and local memory 150, and respectively executed by DSP 128, Processor 105, or local processor 155 of transceiver module 130. Thus, for example, illustrated within memory 110 are a number of software/firmware/logic components/modules, including current correction count and rate data 114, applications 116 and AFC utility 167.

The various components within wireless communication device 100 can be electrically and/or communicatively coupled together as illustrated in FIG. 1. As utilized herein, the term "communicatively coupled" means that information signals are transmissible through various interconnections between the components. The interconnections between the components can be direct interconnections that include conductive transmission media, or may be indirect interconnections that include one or more intermediate electrical components. Although certain direct interconnections are illustrated in FIG. 1, it is to be understood that more, fewer or different interconnections may be present in other embodiments.

FIG. 2A provides a block diagram representation of a transceiver module having a pair of receiver paths and a synchronization module, according to one embodiment. Transceiver module 130 comprises first receiver path 202A and second receiver path 222A. Each receiver path (202A, 222A) comprises (a) RF signal processing stages of RFIC 132 and (b) baseband and intermediate frequency (IF) signal processing stages of BBIC 133. In addition, transceiver module 130 comprises synchronization module 240 and frequency error estimator 260 which is coupled to synchronization module 240. Also included within transceiver module 130 is reference clock 246.

First receiver path 202A comprises down-converter 206, first RF local oscillator (LO) 242 and analog to digital (A/D) converter 208. Down-converter 206 is communicatively coupled to both first RF LO 242 and analog to digital (A/D) converter 208. Down-converter 206, first RF LO 242 and analog to digital (A/D) converter 208 are located within RFIC 132. Illustrated along first receiver path 202A within BBIC 133 are de-rotation component 210 and OFDM time-frequency converter module 212, which comprises filter 214. Additional components of BBIC 133 which are also illustrated along first receiver path 202A include detector 216 and decoder 218. Antenna 140 is communicatively coupled to first receiver path 202A.

Second receiver path 222A comprises down-converter 226, second RF LO 244 and analog to digital (A/D) converter 228. Down-converter 226 is communicatively coupled to both second RF LO 244 and analog to digital (A/D) converter 228. Down-converter 226, second RF LO 244 and analog to digital (A/D) converter 228 are located within RFIC 132. Illustrated along second receiver path 222A and within BBIC 133 are de-rotation component 230 and OFDM time-to-frequency converter module 232, which comprises filter 234. Additional components of BBIC 133 which are also illustrated along second receiver path 222A include detector 236, and decoder 238. Antenna 142 is communicatively coupled to second receiver path 222A.

As illustrated, frequency error estimator 260 is coupled to first and second receiver paths 202A and 222A, and in particular to output ports of detectors 216, 236. However, one skilled in the art is aware that frequency error estimator 260 can be coupled at any one of various alternate locations in order to generate frequency error estimates.

Synchronization module 240 comprises system clock 248, which is coupled to reference clock 246, and from which the various LOs are able to generate the respective synchronization signals. Also illustrated within synchronization module 240 is synchronization controller 160. In one embodiment, synchronization controller 160 is respectively coupled to each of first RF LO 242, second RF LO 244, and system clock 248 in order to receive, adjust and/or distribute the various synchronization signals accordingly. Several inputs 265 which can include correction count and correction rate data 114 are received by synchronization module 240, and in particular, by synchronization controller 160. In one embodiment, in response to obtaining frequency error estimates, synchronization controller 160 is able to apply automatic frequency corrections (AFCs) to the respective clocks and/or oscillators, as illustrated within FIG. 3.

Figure 2B:
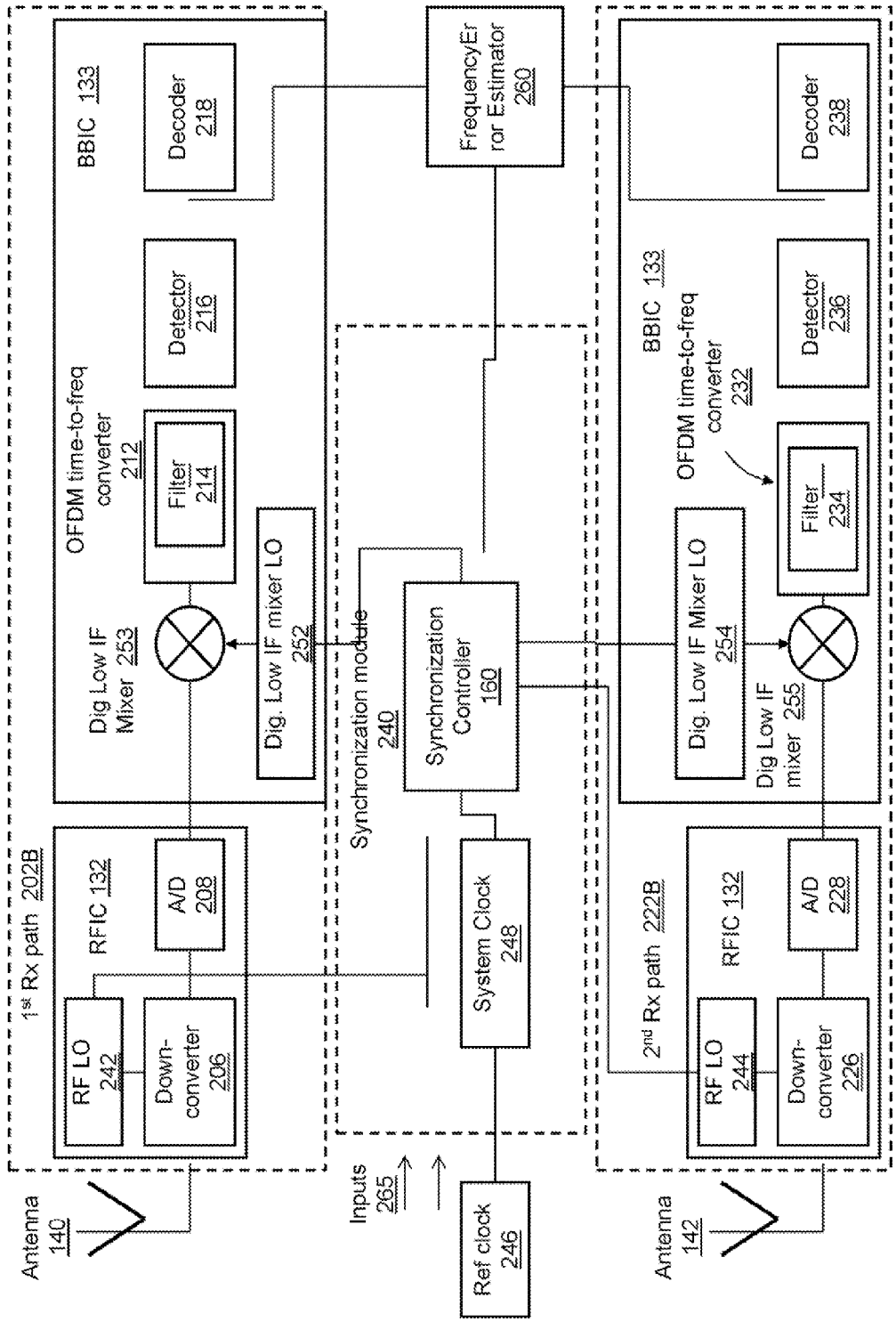
FIG. 2B provides another block diagram representation of a transceiver module having a pair of receiver paths and a synchronization module, according to one embodiment.

FIG. 2A provides a first implementation of transceiver 130 in which synchronization controller 160 is coupled to de-rotation components 210 and 230 within a respective receiver path. FIG. 2B provides a second implementation of transceiver 130 in which synchronization controller 160 is coupled to digital low IF mixer LOs 252 and 254 within a respective receiver path. The calculation of AFC values and selection of corresponding AFC target types are described in further detail within the description of FIG. 3.

FIG. 2B provides another block diagram representation of a transceiver module having a pair of receiver paths and a synchronization module, according to one embodiment. Transceiver module 130 comprises first receiver path 202B and second receiver path 222B. In addition, transceiver module 130 comprises synchronization module 240 and frequency error estimator 260 which is coupled to synchronization module 240. Also included within transceiver module 130 is reference clock 246. Similar to the implementation of FIG. 2A, in FIG. 2B, each receiver path (202A, 202B and 222A, 222B) comprises (a) RF signal processing stages of RFIC 132 and (b) baseband and intermediate frequency (IF) signal processing stages of BBIC 133. Between the implementations of FIGS. 2A and 2B, the RF signal processing stages of RFIC 132 provide similar components. However, the baseband and intermediate frequency (IF) signal processing stages of BBIC 133 provide different components between the implementations of FIGS. 2A and 2B.

First receiver path 202B comprises down-converter 206, first RF LO 242 and analog to digital (A/D) converter 208. Down-converter 206 is communicatively coupled to both first RF LO 242 and analog to digital (A/D) converter 208. Down-converter 206, first RF LO 242 and analog to digital (A/D) converter 208 are located within RFIC 132. Illustrated along first receiver path 202B within BBIC 133 are digital low IF mixer LO 252 and digital low IF mixer 253 which is coupled to digital low IF mixer LO 252. Within first receiver path 202B, BBIC 133 also comprises OFDM time-to-frequency converter module 212, which comprises filter 214. Additional components of BBIC 133 which are also illustrated along first receiver path 202B include detector 216 and decoder 218. Antenna 140 is communicatively coupled to first receiver path 202B.

Second receiver path 222B comprises down-converter 226, second RF LO 244 and analog to digital (A/D) converter 228. Down-converter 226 is communicatively coupled to both second RF LO 244 and analog to digital (A/D) converter 228. Down-converter 226, second RF LO 244 and analog to digital (A/D) converter 228 are located within RFIC 132. Illustrated along second receiver path 222B within BBIC 133 are digital low IF mixer LO 254 and digital low IF mixer 255 which is coupled to digital low IF mixer LO 254. Within second receiver path 222B, BBIC 133 also comprises OFDM time-frequency converter module 232, which comprises filter 234. Additional components of BBIC 133 which are also illustrated along second receiver path 222B include detector 236, and decoder 238. Antenna 142 is communicatively coupled to second receiver path 222B.

As illustrated, frequency error estimator 260 is coupled to first and second receiver paths 202B and 222B, and in particular to output ports of detectors 216, 236. However, one skilled in the art is aware that frequency error estimator 260 can be coupled at any one of various alternate locations in order to generate frequency error estimates.

Synchronization module 240 comprises system clock 248, which is coupled to reference clock 246, and from which the various LOs are able to generate the respective synchronization signals. Also illustrated within synchronization module 240 is synchronization controller 160. In one embodiment, synchronization controller 160 is respectively coupled to each of first RF LO 242, second RF LO 244, and system clock 248 in order to receive, adjust and/or distribute the various synchronization signals accordingly. Several inputs 265 which can include correction count and correction rate data 114 are received by synchronization module 240, and in particular, by synchronization controller 160.

Figure 3:
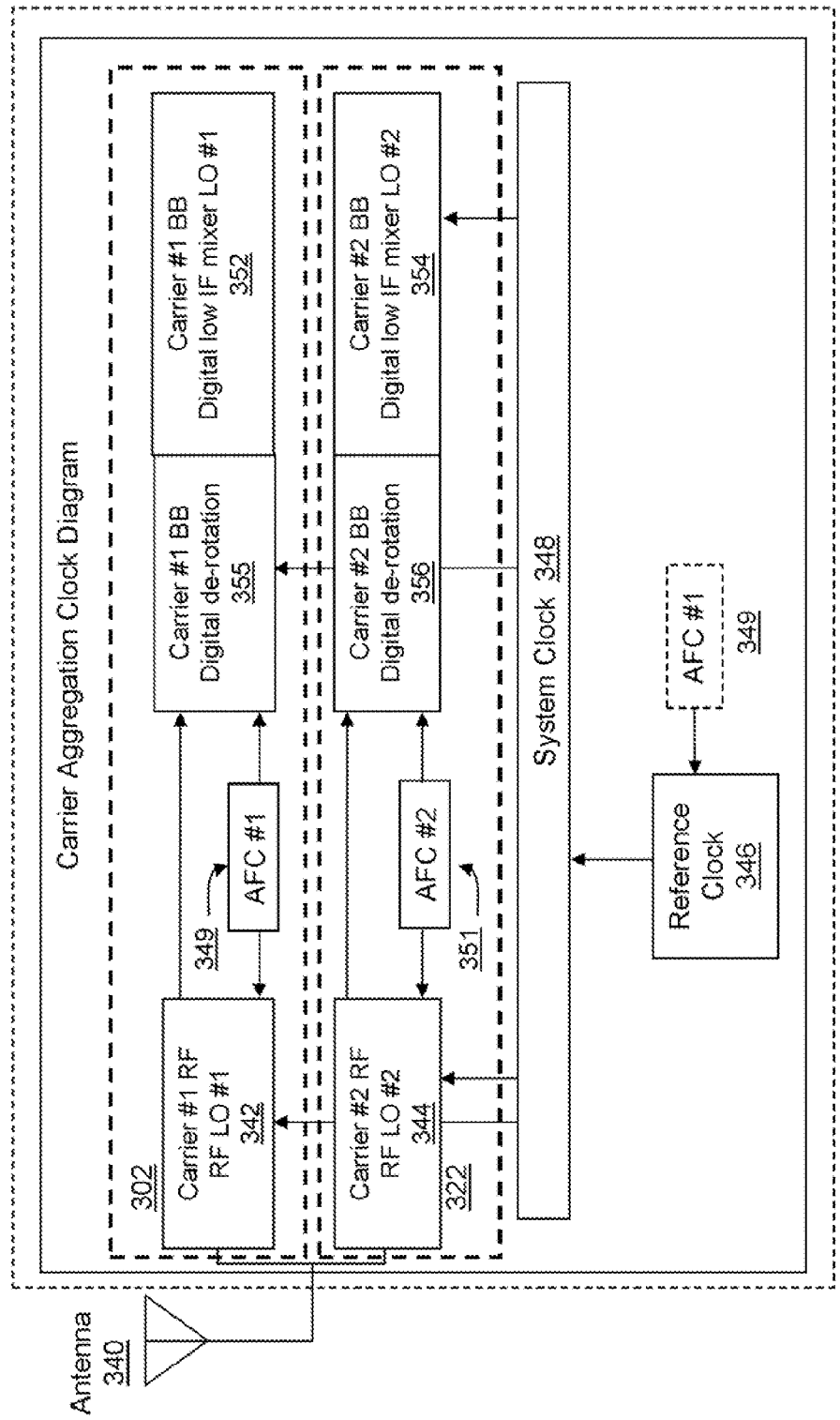
FIG. 3 is a block diagram illustrating an embodiment of a transceiver module comprising two signal processing branches showing the various clock components and/or signals from a synchronization module which provides synchronization for carrier aggregation, according to one embodiment.

FIG. 3 is a block diagram illustrating an embodiment of a transceiver module comprising two signal processing branches showing the various clock components and/or signals from the synchronization module that provide synchronization for carrier aggregation, according to one embodiment. Transceiver module 130 comprises first receiver path 302 and second receiver path 322. First receiver path 302 comprises a down-converter and analog to digital (A/D) converter (not shown), a first RF LO 342, and first digital low IF mixer LO 352. In one embodiment, first receiver path 302 also comprises a digital de-rotation component 355. Also illustrated in first receiver path 302 is a first AFC signal illustrated as AFC#1 349. AFC#1 349 is also shown in a second instance connecting to reference clock 346. Although AFC#1 349 is illustrated as targeting first RF LO 342 and reference clock 346, the illustration is intended to depict two options for a target of a first AFC.

Second receiver path 322 comprises a down-converter and analog to digital (A/D) converter (not shown), a second RF LO 344, and first digital low IF mixer LO 354. In one embodiment, second receiver path 322 also comprises a digital de-rotation component 356. Also illustrated in second receiver path 322 is a second AFC signal illustrated as AFC#2 351. Transceiver module 130 comprises reference clock 346 and system clock 348. Antenna 340 is communicatively coupled to both first receiver path 302 and second receiver path 322.

In first receiver path 302, first RF LO 342 provides synchronization within RFIC 132 (FIG. 1) for a received RF signal provided by a first carrier. First digital low IF mixer LO 352 provides synchronization within BBIC 133 for at least one of a baseband signal and an IF signal provided by the first carrier. The baseband signal and the IF signal provided by the first carrier are down-converted signals corresponding to the received RF signal provided by the first carrier.

Similarly, in second receiver path 322, second RF LO 344 provides synchronization within RFIC 132 for a received RF signal provided by a second carrier. Second digital low IF mixer LO 354 provides synchronization within BBIC 133 for at least one of a baseband signal and an IF signal provided by the second carrier. The baseband signal and the IF signal provided by the second carrier are down-converted signals corresponding to the received RF signal provided by the second carrier.

Synchronization controller 160 estimates (a) a first frequency error between the first received RF signal and a shared synchronization signal provided by reference clock 346 and (b) a second frequency error between a second received RF signal and the shared synchronization signal. The first frequency error and the second frequency error are respectively affected by at least one of: (a) a mapping of specific carrier frequencies to a particular cell tower associated with a respective received signal; (b) a change to the mapping of specific carrier frequencies associated with a handover procedure; and (c) a Doppler rate corresponding to a respective received signal. For example, a first received signal received from a first base-station 145 and which corresponds to first receiver path 202A, 202B may exhibit a different Doppler rate compared to the Doppler rate exhibited by a second received signal received from a second base-station 147 and which corresponds to second receiver path 222A, 222B.

Synchronization controller 160 determines a first AFC for the first frequency error. In particular, synchronization controller 160 determines a value and a type (i.e., a target clock type) for the first AFC. In addition, synchronization controller 160 determines a second AFC based on (a) values corresponding to the second frequency error and (b) the first AFC determined. Synchronization controller 160 synchronously applies (a) the determined first AFC to compensate for the first frequency error and (b) the second AFC determined using the second frequency error.

Synchronization controller 160 selects a type of the first AFC that provides at least one of: (a) an adjustment to a shared synchronization signal; (b) an adjustment to an exclusively local synchronization signal; and (c) a de-rotation of a first carrier signal corresponding to the first received signal. The shared synchronization signal is one of (a) a shared reference clock signal and (b) a shared system clock signal. The exclusively local synchronization signal is one of (a) an unshared RF local oscillator signal and (b) a digital low intermediate frequency (IF) mixer LO signal corresponding to a respective received signal. In response to selecting the type of the first AFC that provides an adjustment to at least the shared synchronization signal, synchronization controller 160 calculates a second AFC using values corresponding to (a) the second frequency error and (b) the adjustment to the at least the shared synchronization signal provided by the first AFC. In response to not selecting the type of the first AFC that provides an adjustment to at least the shared synchronization signal, synchronization controller 160 calculates the second AFC utilizing values corresponding to the second frequency error. In this case, the second AFC is not calculated based on an adjustment associated with the first AFC.

In general, synchronization controller 160 applies the second AFC as at least one of (i) an adjustment to an exclusively local synchronization signal for the second received signal and (ii) a de-rotation of a second carrier signal corresponding to the second received signal. Furthermore, synchronization controller 160 selects a type of a first AFC to apply from among: (a) a first type that provides an adjustment to the shared reference clock signal; (b) a second type that provides an adjustment to a first radio frequency (RF) local oscillator (LO); (c) a third type that provides a de-rotation of a first carrier signal corresponding to the first received signal; and (d) a fourth type that provides an adjustment to a digital low intermediate frequency (IF) mixer LO corresponding to the first received signal.

In general, an AFC is applied to a single target. However, synchronization controller 160 is able to apply at least two partial corrections corresponding to a single AFC, as is explained within the description of table 400 of FIG. 4.

FIG. 4 is a table that provides information about a maximum correction rate and a maximum correction limit for a number of clocks within transceiver 130, according to one embodiment. Table 400 provides clock or synchronization source IDs in a first column and, in a second column, tolerance level of specific applications dependent on the clock for timing and/or synchronization, which applications are sensitive to changes in a corresponding clock signal. An AFC applied to a shared reference or system clock may be restricted to a maximum correction rate and/or maximum correction limit if the reference clock is also shared with an application that is particularly intolerant of frequency or phase changes (e.g. GPS).

In addition, table 400 provides, in a third column, a maximum correction rate that controls a rate at which adjustments are applied to a corresponding clock while the application is running. In a fourth column, table 400 provides a maximum correction limit for a number of instances that adjustments (e.g., AFC#1) can be applied to a corresponding clock while the application is running Additionally, table 400 provides, in a fifth column, a value for the number of dependent receiver paths impacted by changes to a corresponding clock signal. In one embodiment, table 400 is stored in local memory 150.

Synchronization controller 160 establishes at least one of a maximum correction rate and a maximum correction limit associated with the shared reference clock signal, which is associated with a specific tolerance level of an application for frequency changes and phase changes. The specific tolerance level is used to establish at least one of the maximum correction rate and the maximum correction limit associated with the shared reference clock signal.

Synchronization controller 160 applies a first correction that does not cause a violation of the at least one of the maximum correction rate and the maximum correction limit to the shared reference clock signal. The first correction is one of (a) the first AFC and (b) a partial correction corresponding to the first AFC. Synchronization controller 160 selects the type of AFC to apply based on at least one of: (a) the maximum correction rate; (b) the maximum correction limit; (c) a complexity associated with an adjustment; and (d) a number of further adjustments that are triggered by selection of a particular type of AFC.

Referring specifically to table 400, first row 402 of table 400 provides information to guide an AFC of a reference clock. "App1" is identified as an application that is sensitive to adjustments and/or AFCs applied to the reference clock. In particular, tolerance level "c" is a value that provides a quantitative measure of the sensitivity of App1 to adjustments to the reference clock. First row 402 also provides specific values, "rate1" for maximum correction rate and "limit1" for maximum correction limit. These values are both used to guide changes to the reference clock when App1 is running. In addition, first row 402 indicates that two receiver paths are affected by changes to the reference clock.

Second row 404 also provides information that synchronization controller 160 uses to determine whether to apply an AFC to a reference clock. However, the information is provided for a different "sensitive" application "App2" that has a different tolerance level, "d". A "sensitive" application is described herein as an application having a tolerance level (to changes to the reference clock) that is less than a pre-determined threshold minimum level. Third row 406 provides information to determine whether to apply an AFC to a system clock. Fourth row 408 provides information to determine whether to apply an AFC to a shared clock identified in table 400 as "shared clock". Synchronization controller 160 is able to utilize information retrieved from second row 404, third row 406 and fourth row 408 similarly to the manner in which synchronization controller 160 is able to utilize the information in first row 402.

In one embodiment, synchronization controller 160 determines whether to apply a first AFC to the reference clock by determining whether any application identified within the corresponding rows of a second column of table 400 (i.e., any application that is particularly sensitive to changes to the reference clock) is running. In response to determining that at least one of the applications (e.g., App1) that is particularly sensitive to changes to the reference clock is executing, synchronization controller 160 retrieves a current count of the number of AFCs to the reference clock while the at least one application is running. In addition, synchronization controller 160 retrieves a correction rate that provides an updated value for the rate at which AFCs are applied to the reference clock while the at least one application is running Synchronization controller 160 compares the retrieved values for maximum correction rate and maximum correction limit and respectively compares these retrieved values to the current count of the number of AFCs applied to the reference clock and the current correction rate. As a result, synchronization controller 160 determines whether there is at least one application with corresponding current count and/or correction rate values that equal the maximum correction rate and maximum correction limit values. In one embodiment, if synchronization controller 160 determines that there is at least one application with corresponding current count and/or correction rate values that equal the maximum correction rate and maximum correction limit values retrieved from table 400, synchronization controller 160 does not apply an AFC to the reference clock and selects another type of AFC to apply. However, if synchronization controller 160 determines that there is no application with corresponding current count and/or correction rate values that equal the maximum correction rate and maximum correction limit values retrieved from table 400, synchronization controller 160 applies the AFC to the reference clock and updates the current count and correction rate.

In another embodiment, if the current count and correction rate values are both less than the maximum correction rate and maximum correction limit values, and if all the receiver paths that are affected by changes to the reference clock are actively propagating received signals, synchronization controller 160 is able to apply an AFC to the reference clock if the number of actively propagating receiver paths is less than a threshold number of receiver paths affected by AFCs to the reference clock. Synchronization controller 160 uses the threshold number of receiver paths affected by AFCs to the reference clock to avoid and/or minimize a complexity associated with providing compensation within a number of second AFCs corresponding to the receiver paths that can be affected.

In one embodiment, table 400 includes information for maximum phase change and/or maximum frequency change. Synchronization controller 160 utilizes the maximum allowed phase change and/or maximum allowed frequency change to determine the maximum level of adjustment that is allowed by any single AFC applied to a shared clock such as the reference clock when a respective application is running. As a result, synchronization controller 160 is able to perform partial AFCs. In particular, synchronization controller 160 can perform a first partial correction (i.e., a correction that is less than a complete AFC) to the reference clock up to a specified maximum allowed phase change and a remainder of the complete AFC can be performed using another partial AFC on a clock which provides synchronization for a corresponding received signal and is not utilized by the respective application.

Figure 5:
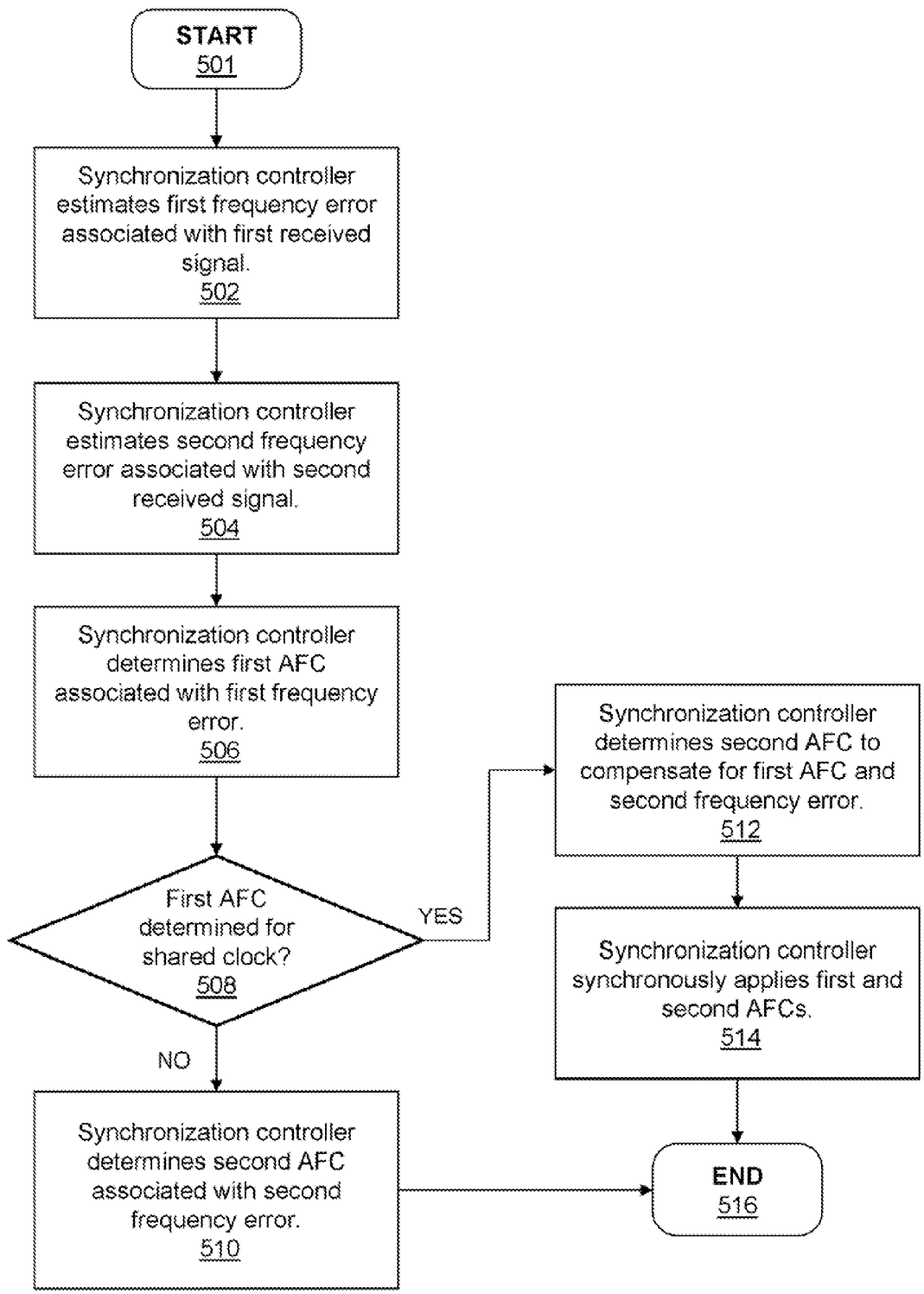
FIG. 5 is a flow chart illustrating one embodiment of a method for providing an automatic frequency correction (AFC) within a wireless communication device, according to one embodiment.
Figure 6:
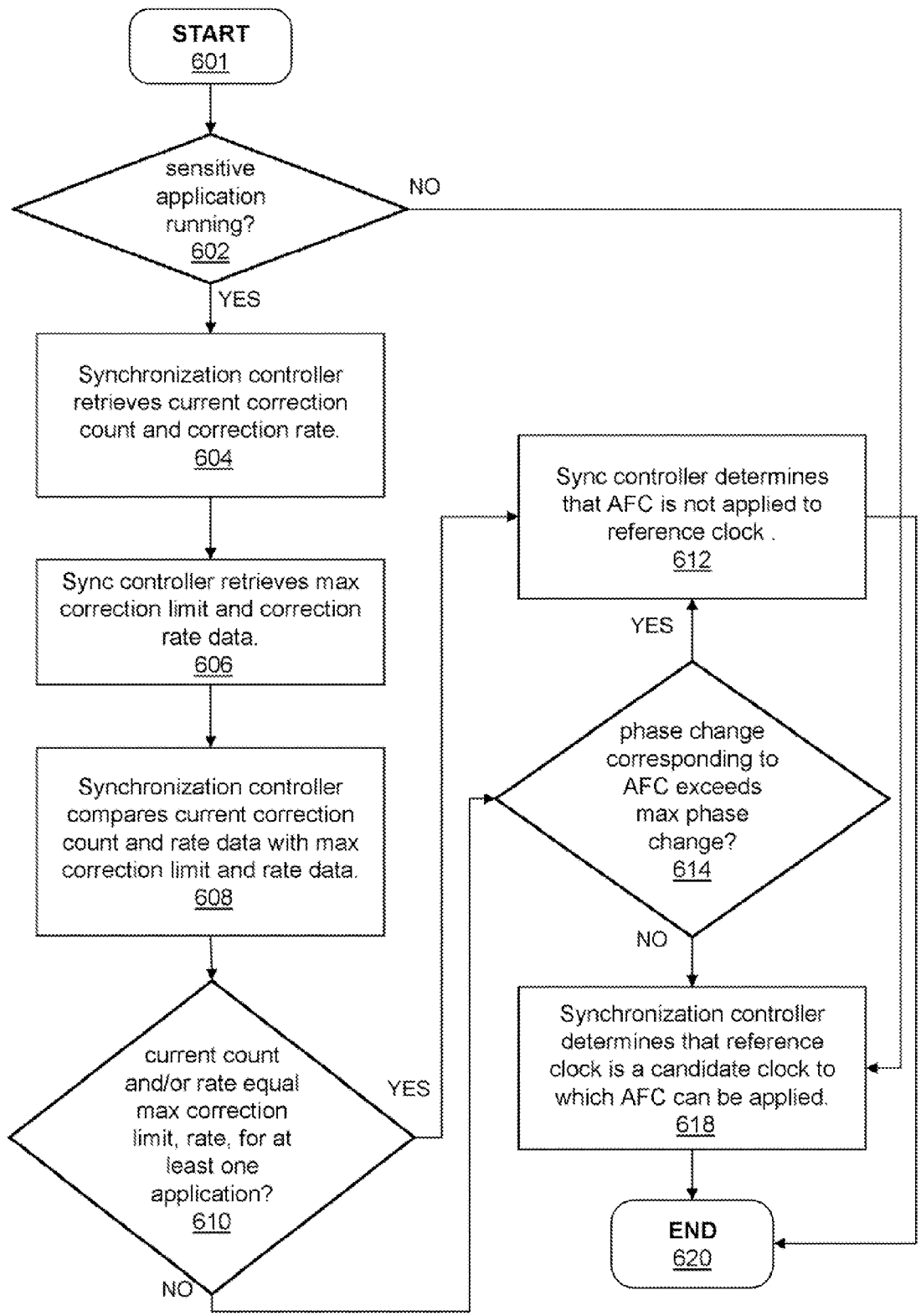
FIG. 6 is a flow chart illustrating one embodiment of a method for determining whether a shared clock is a candidate clock to which a first AFC can be applied, according to one embodiment.

FIGS. 5 and 6 are flow charts illustrating an embodiment of the method by which the above processes of the illustrative embodiments can be implemented. Specifically, FIG. 5 illustrates one embodiment of a method for providing automatic frequency corrections within a wireless communication device. FIG. 6 illustrates one embodiment of a method for determining whether a shared clock such as reference clock 246 is a candidate clock to which a first AFC can be applied. Although the method illustrated by FIGS. 5 and 6 may be described with reference to components and functionality illustrated by and described in reference to FIGS. 1-4, it should be understood that this is merely for convenience and alternative components and/or configurations thereof can be employed when implementing the method. Certain portions of the methods may be completed by AFC utility 167 executing on one or more processors (processor 105 or DSP 128) within wireless communication device 100 (FIG. 1), or local processor 155 or synchronization controller 160 of transceiver module 130 (FIGS. 1 and 2). The executed processes then control specific operations of or on transceiver module 130. For simplicity in describing the method, all method processes are described from the perspective of transceiver module 130 and specifically synchronization controller 160.

The method of FIG. 5 begins at initiator block 501 and proceeds to block 502 at which synchronization controller 160 estimates a first frequency error associated with a first received signal corresponding to a first receiver path. At block 504, synchronization controller 160 estimates a second frequency error associated with a second received signal corresponding to a second receiver path. At block 506, synchronization controller 160 determines a first AFC associated with the first frequency error. At decision block 508, synchronization controller 160 determines whether the first AFC is determined to target a shared clock such as reference clock 246. If at decision block 508, synchronization controller 160 determines that the first AFC is not determined to target a shared clock such as reference clock 246, synchronization controller 160 determines/generated the second AFC to compensate for the second frequency error, as shown at block 510. However, if at decision block 508, synchronization controller 160 determines that the first AFC is determined to target a shared clock such as reference clock 246, synchronization controller 160 generates the second AFC to compensate for the first AFC and the second frequency error, as shown at block 512. At block 514, synchronization controller 160 synchronously applies the first and second AFCs to the relevant clocks. The process ends at block 516.

The method of FIG. 6 begins at initiator block 601 and proceeds to decision block 602 at which synchronization controller 160 determines whether an application having less than a threshold minimum tolerance level to changes in a corresponding clock signal is running. An application having less than the threshold minimum tolerance level is described herein as a "sensitive" application. Synchronization controller 160 determines whether an application having less than a threshold minimum tolerance level is running in order to initiate a process to determine whether a shared clock such as reference clock 246 is a candidate clock to which a first AFC can be applied. If at decision block 602, synchronization controller 160 determines that no application having less than the threshold minimum tolerance level is running, synchronization controller 160 determines that the reference clock is a candidate clock to which the first AFC can be applied, as shown at block 618. However, if at decision block 602, synchronization controller 160 determines that at least one application having less than the threshold minimum tolerance level is running, synchronization controller 160 retrieves the current correction count and correction rate data, as shown at block 604. At block 606, synchronization controller 160 retrieves the maximum correction limit and correction rate data. At block 608, synchronization controller 160 respectively compares the current correction count and current correction rate with the maximum correction limit and the maximum correction rate.

At decision block 610, synchronization controller 160 determines whether at least one of the current correction count and the current correction rate respectively equals the maximum correction limit and the maximum correction rate, for at least one currently executing application. If at decision block 610, synchronization controller 160 determines that there is at least one currently executing application for which at least one of the current correction count and the current correction rate respectively equals the maximum correction limit and the maximum correction rate, synchronization controller 160 determines that the reference clock is not a candidate clock to which the first AFC can be applied, as shown at block 612. However, if at decision block 610, synchronization controller 160 determines that there is no currently executing application for which at least one of the current correction count and the current correction rate respectively equals the maximum correction limit and the maximum correction rate, synchronization controller 160 determines whether the phase change corresponding to the first AFC exceeds the maximum phase change that can be tolerated by at least one "sensitive application", as shown at block 614. If at decision block 614, synchronization controller 160 determines that the phase change corresponding to the first AFC exceeds the maximum phase change that can be tolerated by at least one "sensitive application", synchronization controller 160 determines that the reference clock is not a candidate clock to which the first AFC can be applied, as shown at block 612. However, if at decision block 614, synchronization controller 160 determines that the phase change corresponding to the first AFC does not exceed the maximum phase change that can be tolerated by at least one "sensitive application", synchronization controller 160 determines that the reference clock is a candidate clock to which the first AFC can be applied, as shown at block 618. The process ends at block 620.

The flowchart and block diagrams in the various figures presented and described herein illustrate the architecture, functionality, and operation of possible implementations of systems, methods and computer program products according to various embodiments of the present disclosure. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Thus, while the method processes are described and illustrated in a particular sequence, use of a specific sequence of processes is not meant to imply any limitations on the disclosure. Changes may be made with regards to the sequence of processes without departing from the spirit or scope of the present disclosure. Use of a particular sequence is therefore, not to be taken in a limiting sense, and the scope of the present disclosure extends to the appended claims and equivalents thereof.

In some implementations, certain processes of the methods are combined, performed simultaneously or in a different order, or perhaps omitted, without deviating from the spirit and scope of the disclosure. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method for providing automatic frequency correction (AFC) in a wireless communication device having at least two transceivers, the method comprising:
    estimating a first frequency error between a first received signal corresponding to a first transceiver and a shared reference clock signal;
    estimating a second frequency error between a second received signal corresponding to a second transceiver and the shared reference clock signal;

determining a first AFC for the first frequency error by selecting a type of the first AFC that provides at least one of: (a) an adjustment to a shared synchronization signal; (b) an adjustment to an exclusively local synchronization signal; and (c) a de-rotation of a first carrier signal corresponding to the first received signal;

in response to selecting the type of the first AFC that provides an adjustment to at least the shared synchronization signal, calculating a second AFC using values corresponding to (a) the second frequency error and (b) the adjustment to the at least the shared synchronization signal provided by the first AFC;

in response to not selecting the type that provides an adjustment to the shared synchronization signal, calculating the second AFC utilizing values corresponding to the second frequency error, wherein the second AFC is not calculated based on an adjustment associated with the first AFC; and synchronously applying (a) the determined first AFC to compensate for the first frequency error and (b) the second AFC determined using the second frequency error.

2. The method of claim 1, wherein said synchronously applying further comprises:

applying the second AFC as at least one of (i) an adjustment to an exclusively local synchronization signal for the second received signal and (ii) a de-rotation of a second carrier signal corresponding to the second received signal.

3. The method of claim 2, wherein:

the shared synchronization signal is one of (a) a shared reference clock signal and (b) a shared system clock signal;

the exclusively local synchronization signal is one of (a) an unshared RF local oscillator signal and (b) a digital low intermediate frequency (IF) mixer LO signal corresponding to a respective received signal.

4. The method of claim 1, wherein:

the first frequency error and the second frequency error are respectively affected by at least one of: (a) a mapping of specific carrier frequencies to a particular cell tower associated with a respective received signal; (b) a change to the mapping of specific carrier frequencies associated with a handover procedure; and (c) a Doppler rate corresponding to a respective received signal.

5. A method for providing automatic frequency correction (AFC) in a wireless communication device having at least two transceivers, the method comprising:

estimating a first frequency error between a first received signal corresponding to a first transceiver and a shared reference clock signal;

estimating a second frequency error between a second received signal corresponding to a second transceiver and the shared reference clock signal;

determining a first AFC for the first frequency error;

determining a second AFC based on (a) values corresponding to the second frequency error and (b) the first AFC determined;

establishing at least one of a maximum correction rate and a maximum correction limit associated with the shared reference clock signal, wherein the shared reference clock signal is utilized by an application associated with a specific tolerance level for frequency changes and phase changes, and the specific tolerance level is used to establish at least one of the maximum correction rate and the maximum correction limit associated with the shared reference clock signal;

applying a first correction that does not cause a violation of the at least one of the maximum correction rate and the maximum correction limit to the shared reference clock signal, wherein the first correction is one of (a) the first AFC; and (b) a partial correction corresponding to the first AFC; and synchronously applying (a) the determined first AFC to compensate for the first frequency error and (b) the second AFC determined using the second frequency error.

6. The method of claim 5, wherein said determining the first AFC further comprises:

selecting a type of the first AFC that provides at least one of: (a) an adjustment to a shared synchronization signal; (b) an adjustment to an exclusively local synchronization signal; and (c) a de-rotation of a first carrier signal corresponding to the first received signal;

in response to selecting the type of the first AFC that provides an adjustment to at least the shared synchronization signal, calculating a second AFC using values corresponding to (a) the second frequency error and (b) the adjustment to the at least the shared synchronization signal provided by the first AFC; and in response to not selecting the type that provides an adjustment to the shared synchronization signal, calculating the second AFC utilizing values corresponding to the second frequency error, wherein the second AFC is not calculated based on an adjustment associated with the first AFC.

7. The method of claim 5, further comprising:

selecting the type of AFC to apply based on at least one of: (a) the maximum correction rate; (b) the maximum correction limit; (c) a complexity associated with an adjustment; and (d) a number of further adjustments that are triggered by selection of a particular type of AFC; and wherein the type of AFC is one of: (a) a first type that provides an adjustment to the shared reference clock signal; (b) a second type that provides an adjustment to a first radio frequency (RF) local oscillator (LO); (c) a third type that provides a de-rotation of a first carrier signal corresponding to the first received signal; and (d) a fourth type that provides an adjustment to a digital low intermediate frequency (IF) mixer LO corresponding to the first received signal.

8. A transceiver integrated circuit (IC) comprising:

at least two transceivers;

a shared reference clock utilized for signal detection at a first transceiver and a second transceiver;

a frequency error estimator that estimates: (a) a first frequency error between a first received signal corresponding to a first transceiver and the shared reference clock signal; and (b) a second frequency error between a second received signal corresponding to a second transceiver and the shared reference clock signal; and an automatic frequency correction (AFC) module that:

determines a first AFC for the first frequency error by selecting a type of the first AFC that provides at least one of: (a) an adjustment to a shared synchronization signal; (b) an adjustment to an exclusively local synchronization signal; and (c) a de-rotation of a first carrier signal corresponding to the first received signal;

in response to selecting the type of the first AFC that provides an adjustment to at least the shared synchronization signal, calculating a second AFC using values corresponding to (a) the second frequency error and (b) the adjustment to the at least the shared synchronization signal provided by the first AFC; and in response to not selecting the type that provides an adjustment to the shared synchronization signal, calculating the second AFC using values corresponding to the second frequency error, wherein the second AFC is not calculated based on an adjustment associated with the first AFC; and synchronously applies (a) the determined first AFC to compensate for the first frequency error; and (b) the second AFC determined using the second frequency error.

9. The transceiver IC of claim 8, wherein the AFC module:
applies the second AFC as at least one of (i) an adjustment to an exclusively local synchronization signal for the second received signal; and (ii) a de-rotation of a second carrier signal corresponding to the second received signal.

10. The transceiver IC of claim 9, wherein:
the shared synchronization signal is one of a shared reference clock signal and (b) a shared system clock signal;
the exclusively local synchronization signal is one of (a) an unshared RF local oscillator signal and (b) a digital low intermediate frequency (IF) mixer LO signal corresponding to a respective received signal.

11. The transceiver IC of claim 8, wherein:
the first frequency error and the second frequency error are respectively affected by at least one of: (a) a mapping of specific carrier frequencies to a particular cell tower associated with a respective received signal; (b) a change to the mapping of specific carrier frequencies associated with a handover procedure; and (c) a Doppler rate corresponding to a respective received signal.

12. A transceiver integrated circuit (IC) comprising:
at least two transceivers;
a shared reference clock utilized for signal detection at a first transceiver and a second transceiver;
a frequency error estimator that estimates: (a) a first frequency error between a first received signal corresponding to a first transceiver and the shared reference clock signal; and (b) a second frequency error between a second received signal corresponding to a second transceiver and the shared reference clock signal; and
an automatic frequency correction (AFC) module that:
determines a first AFC for the first frequency error;
determines a second AFC based on (a) values corresponding to the second frequency error and (b) the first AFC determined;
establishes at least one of a maximum correction rate and a maximum correction limit associated with the shared reference clock signal, wherein the shared reference clock signal is utilized by an application associated with a specific tolerance level for frequency changes and phase changes, and the specific tolerance level is used to establish at least one of the maximum correction rate and the maximum correction limit associated with the shared reference clock signal;
applies a first correction that does not cause a violation of the at least one of the maximum correction rate and the maximum correction limit to the shared reference clock signal, wherein the first correction is one of (a) the first AFC; and (b) a partial correction corresponding to the first AFC; and
synchronously applies (a) the determined first AFC to compensate for the first frequency error; and (b) the second AFC determined using the second frequency error.

13. The transceiver IC of claim 12, wherein the AFC module:
selects a type of the first AFC that provides at least one of: (a) an adjustment to a shared synchronization signal; (b) an adjustment to an exclusively local synchronization signal; and (c) a de-rotation of a first carrier signal corresponding to the first received signal;
in response to selecting the type of the first AFC that provides an adjustment to at least the shared synchronization signal, calculating a second AFC using values corresponding to (a) the second frequency error and (b) the adjustment to the at least the shared synchronization signal provided by the first AFC; and
in response to not selecting the type that provides an adjustment to the shared synchronization signal, calculating the second AFC using values corresponding to the second frequency error, wherein the second AFC is not calculated based on an adjustment associated with the first AFC.

14. The transceiver IC of claim 12, wherein the AFC module:
selects the type of AFC to apply based on at least one of: (a) the maximum correction rate; (b) the maximum correction limit; (c) a complexity associated with an adjustment; and (d) a number further adjustments that are triggered by selection of a particular type of AFC; and
wherein the type of AFC is one of: (a) a first type that provides an adjustment to the shared reference clock signal; (b) a second type that provides an adjustment to a first radio frequency (RF) local oscillator (LO); (c) a third type that provides a de-rotation of a first carrier signal corresponding to the first received signal; and (d) a fourth type that provides an adjustment to a digital low intermediate frequency (IF) mixer LO corresponding to the first received signal.

15. A wireless communication device having a transceiver integrated circuit (IC) coupled to at least one antenna and which includes:
at least one processor;
at least two transceivers;
a shared reference clock utilized for signal reception at a first transceiver and a second transceiver;
a frequency error estimator that estimates: (a) a first frequency error between a first received signal corresponding to a first transceiver and a shared reference clock signal; and (b) a second frequency error between a second received signal corresponding to a second transceiver and the shared reference clock signal; and
an automatic frequency correction (AFC) module that:
determines a first AFC for the first frequency error by selecting a type of the first AFC that provides at least one of: (a) an adjustment to a shared synchronization signal; (b) an adjustment to an exclusively local synchronization signal; and (c) a de-rotation of a first carrier signal corresponding to the first received signal;
in response to selecting the type that provides an adjustment to at least the shared synchronization signal, calculating a second AFC using values corresponding to (a) the second frequency error and (b) the adjustment to the at least the shared synchronization signal provided by the first AFC;
in response to not selecting the type that provides an adjustment to the shared synchronization signal, calculating the second AFC using values corresponding to the second frequency error, wherein the second AFC is not calculated based on an adjustment associated with the first AFC; and synchronously applies (a) the determined first AFC to compensate for the first frequency error; and (b) the second AFC determined using the second frequency error, wherein the AFC module applies the second AFC as at least one of (i) an adjustment to an exclusively local synchronization signal for the second received signal; and (ii) a de-rotation of a second carrier signal corresponding to the second received signal.

16. The wireless communication device of claim 15, wherein:
the shared synchronization signal is one of (a) a shared reference clock signal and (b) a shared system clock signal;
the exclusively local synchronization signal is one of (a) an unshared RF local oscillator signal and (b) a digital low intermediate frequency (IF) mixer LO signal corresponding to a respective received signal.

17. The wireless communication device of claim 15, wherein:
the first frequency error and the second frequency error are respectively affected by at least one of: (a) a mapping of specific carrier frequencies to a particular cell tower associated with a respective received signal; (b) a change to the mapping of specific carrier frequencies associated with a handover procedure; and (c) a Doppler rate corresponding to a respective received signal.

18. A wireless communication device having a transceiver integrated circuit (IC) coupled to at least one antenna and which includes:
at least one processor;
at least two transceivers;
a shared reference clock utilized for signal reception at a first transceiver and a second transceiver;
a frequency error estimator that estimates: (a) a first frequency error between a first received signal corresponding to a first transceiver and a shared reference clock signal; and (b) a second frequency error between a second received signal corresponding to a second transceiver and the shared reference clock signal; and
an automatic frequency correction (AFC) module that:
determines a first AFC for the first frequency error;
determines a second AFC based on (a) values corresponding to the second frequency error and (b) the first AFC determined;
establishes at least one of a maximum correction rate and a maximum correction limit associated with the shared reference clock signal, wherein the shared reference clock signal is utilized by an application associated with a specific tolerance level for frequency changes and phase changes, and the specific tolerance level is used to establish at least one of the maximum correction rate and the maximum correction limit associated with the shared reference clock signal;
applies a first correction that does not cause a violation of the at least one of the maximum correction rate and the maximum correction limit to the shared reference clock signal, wherein the first correction is one of (a) the first AFC; and (b) a partial correction corresponding to the first AFC; and
synchronously applies (a) the determined first AFC to compensate for the first frequency error; and (b) the second AFC determined using the second frequency error.

19. The wireless communication device of claim 18, wherein the AFC module:
selects a type of the first AFC that provides at least one of: (a) an adjustment to a shared synchronization signal; (b) an adjustment to an exclusively local synchronization signal; and (c) a de-rotation of a first carrier signal corresponding to the first received signal;
in response to selecting the type that provides an adjustment to at least the shared synchronization signal, calculating a second AFC using values corresponding to (a) the second frequency error and (b) the adjustment to the at least the shared synchronization signal provided by the first AFC;
in response to not selecting the type that provides an adjustment to the shared synchronization signal, calculating the second AFC using values corresponding to the second frequency error, wherein the second AFC is not calculated based on an adjustment associated with the first AFC; and
applies the second AFC as at least one of (i) an adjustment to an exclusively local synchronization signal for the second received signal; and (ii) a de-rotation of a second carrier signal corresponding to the second received signal.

20. The wireless communication device of claim 18, wherein the AFC module:
selects the type of AFC to apply based on at least one of: (a) the maximum correction rate; (b) the maximum correction limit; (c) a complexity associated with an adjustment; and (d) a number of further adjustments that are triggered by selection of a particular type of AFC; and
wherein the type of AFC is one of: (a) a first type that provides an adjustment to the shared reference clock signal; (b) a second type that provides an adjustment to a first radio frequency (RF) local oscillator (LO); (c) a third type that provides a de-rotation of a first carrier signal corresponding to the first received signal; and (d) a fourth type that provides an adjustment to a digital low intermediate frequency (IF) mixer LO corresponding to the first received signal.

* * * * *